United States Patent
La Fratta

(10) Patent No.: US 10,460,773 B2
(45) Date of Patent: *Oct. 29, 2019

(54) APPARATUSES AND METHODS FOR CONVERTING A MASK TO AN INDEX

(71) Applicant: Micron Technology, Inc., Boise, ID (US)

(72) Inventor: Patrick A. La Fratta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

This patent is subject to a terminal disclaimer.

(21) Appl. No.: 16/047,949

(22) Filed: Jul. 27, 2018

(65) Prior Publication Data

US 2018/0336933 A1 Nov. 22, 2018

Related U.S. Application Data

(63) Continuation of application No. 15/687,813, filed on Aug. 28, 2017, now Pat. No. 10,037,786, which is a continuation of application No. 14/955,520, filed on Dec. 1, 2015, now Pat. No. 9,747,960.

(60) Provisional application No. 62/085,942, filed on Dec. 1, 2014.

(51) Int. Cl.
  *G11C 7/06* (2006.01)
  *G11C 7/10* (2006.01)

(52) U.S. Cl.
  CPC .............. *G11C 7/06* (2013.01); *G11C 7/1006* (2013.01)

(58) Field of Classification Search
  CPC ................................ G11C 7/06; G11C 7/1006
  USPC ..................................................... 365/189.11
  See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

5tojmenovic, "Multiplicative Circulant Networks Topological Properties and Communication Algorithms", (25 pgs.), Discrete Applied Mathematics 77 (1997) 281-305.*

(Continued)

*Primary Examiner* — Huan Hoang
*Assistant Examiner* — Muna A Techane
(74) *Attorney, Agent, or Firm* — Brooks, Cameron & Huebsch, PLLC

(57) ABSTRACT

The present disclosure includes apparatuses and methods related to converting a mask to an index. An example apparatus comprises an array of memory cells and periphery logic configured to: generate an indicator mask by resetting, in response to a first control signal, a second digit of a mask different from a first digit of the mask that is set; and convert, in response to a second control signal, a digit position in the indicator mask of the first digit that is set to an identifier value as an index.

20 Claims, 8 Drawing Sheets

(56) References Cited

U.S. PATENT DOCUMENTS

| | | |
|---|---|---|
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,757,703 B2 | 6/2004 | Shain |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 * | 7/2009 | Noda ............... G11C 7/1006 711/154 |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,724,565 B2 | 5/2010 | Barth et al. |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,437,215 B2 * | 5/2013 | Cheng ............... G11C 7/12 365/189.02 |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |

(56) References Cited

U.S. PATENT DOCUMENTS

| | | |
|---|---|---|
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0207642 A1* | 8/2009 | Shimano ............ G11C 8/04 365/72 |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Multiplicative circulant networks topological properties and communication algorithms Discrete Applied Mathematics 77 (1997) 281-305.*

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html*

Vol. 2, pp. 301-304, 2003 IEEE International Conference on Accoustics, Speech, and Signal Processing.*

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

(56) References Cited

OTHER PUBLICATIONS

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.)

U.S. Appl. No. 13/774,553, entitled, "Neural Network in a Memory Device," filed Feb. 22, 2013, (63 pgs.)

U.S. Appl. No. 13/796,189, entitled, "Performing Complex Arithmetic Functions in a Memory Device," filed Mar. 12, 2013, (23 pgs.)

* cited by examiner

TABLE 7-1

| A (744) | B (745) | NOT OPEN (756) | OPEN TRUE (770) | OPEN INVERT (771) |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

775 → (crossover between rows)

TABLE 7-2

| | | | | | | | | | | | |
|---|---|---|---|---|---|---|---|---|---|---|---|
| | FF | 0 | 0 | 0 | 0 | 0 | 0 | 1 | 1 | 1 | ← 776 |
| | FT | 0 | 0 | 0 | 1 | 1 | 1 | 0 | 0 | 0 | ← 777 |
| | TF | 0 | 0 | 1 | 0 | 0 | 1 | 0 | 0 | 1 | ← 778 |
| | TT | 0 | 1 | 0 | 0 | 1 | 0 | 0 | 1 | 0 | ← 779 |
| A | B | A | A*B | A*B̄ | A+B | B | AXB | A+B̄ | ĀXB | B̄ | ← 747 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

(776–779 braced as 780)

*Fig. 7*

APPARATUSES AND METHODS FOR CONVERTING A MASK TO AN INDEX

PRIORITY INFORMATION

This application is a Continuation of U.S. application Ser. No. 15/687,813, filed Aug. 28, 2017, which issues as U.S. Pat. No. 10,037,786 on Jul. 31, 2018, which is a Continuation of U.S. application Ser. No. 14/955,520, filed Dec. 1, 2015, which issued as U.S. Pat. No. 9,747,960 on Aug. 29, 2017, which claims the benefit of U.S. Provisional Application No. 62/085,942, filed Dec. 1, 2014, the contents of which are incorporated herein by reference.

TECHNICAL FIELD

The present disclosure relates generally to semiconductor memory and methods, and more particularly, to apparatuses and methods related to converting a mask to an index.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory device, in which a processor may be implemented internal and/or near to a memory (e.g., directly on a same chip as the memory array). A processing-in-memory device may save time by reducing and/or eliminating external communications and may also conserve power.

BRIEF DESCRIPTION OF THE DRAWINGS

FIG. 7 is a logic table illustrating selectable logic operation results implemented by sensing circuitry shown in FIG. 6 in accordance with a number of embodiments of the present disclosure.

DETAILED DESCRIPTION

Figure 1:
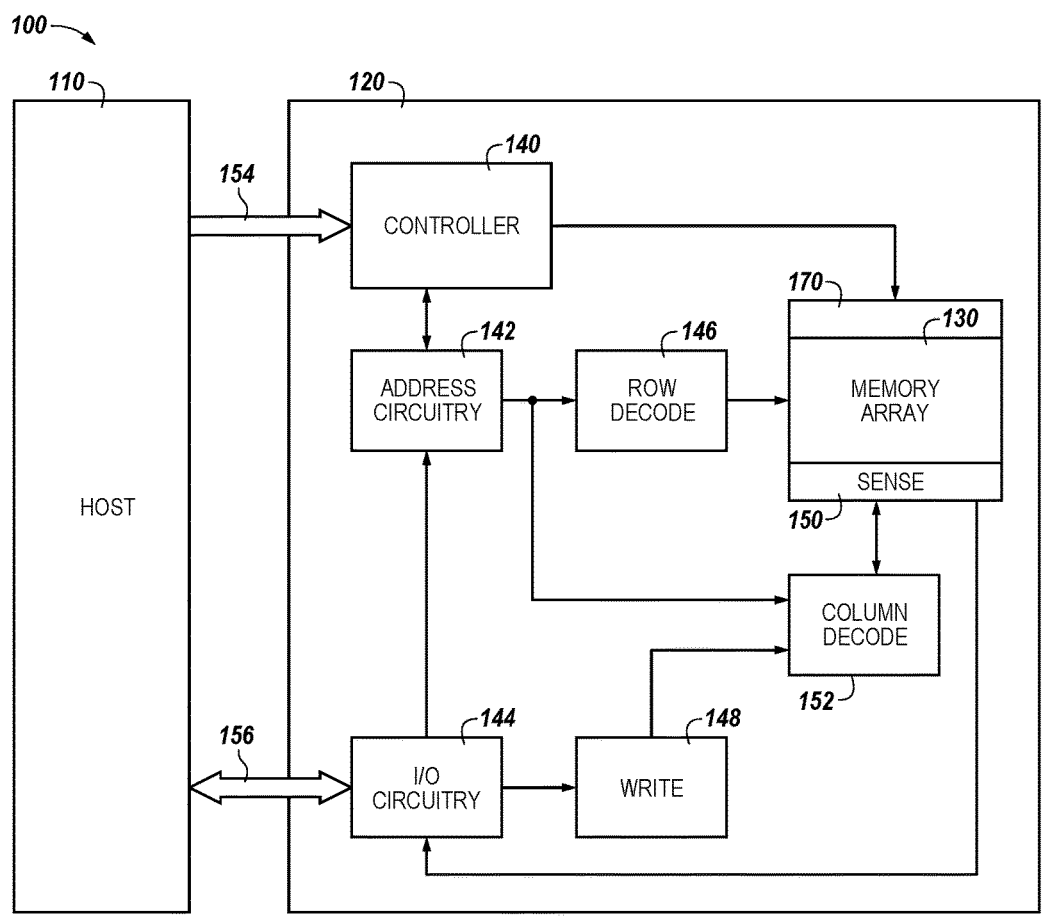
FIG. 1 is a block diagram of an apparatus in the form of an electronic system including a memory device in accordance with a number of embodiments of the present disclosure.

The present disclosure includes apparatuses and methods related to converting a mask to an index. An example apparatus comprises an array of memory cells and periphery logic configured to: generate an indicator mask by resetting, in response to a first control signal, a second digit of a mask different from a first digit of the mask that is set; and convert, in response to a second control signal, a digit position in the indicator mask of the first digit that is set to an identifier value as an index.

An efficient mechanism for converting a mask (e.g., bitmask) to a series of indices can be beneficial. For example, functions utilizing a Processing-In-Memory (PIM) device may benefit from converting a column-wise bitmask to a series of indices indicating set bits in an array, or portion thereof. According to various embodiments, memory cells of a row of a memory array can be programmed to store data values. The memory cells of a particular row of the memory array can be programmed, as a mask, to indicate whether other memory cells (e.g., in a corresponding column) are programmed to a particular data value. Memory cells (e.g., in a particular row of the memory array) can be programmed to a data value corresponding to a logic "1" whenever a memory cell in some range (e.g., same column) is programmed to a data value corresponding to a logic "1." The range of the column may be the entire column or a portion of the column.

According to one example, a mask can be used to reflect results of a search operation for some data value Z stored in the memory array, where Z may occur multiple times in the memory array. Vectors that might contain data value Z may be stored vertically in the memory array, in a column of the memory array, for instance. A search for Z can be implemented by comparisons of each digit of a vector with the data value Z. Comparisons involving multiple columns can be performed in parallel using a memory device with sensing circuitry controllable to perform the comparisons associated with respective columns of memory cells.

The data value Z can be stored in the sensing circuitry associated with a column, which can be used in a compare operation in the sensing circuitry involving the data value Z and a reference data value stored in a memory cell in the associated column. Results of the compare operation can be stored in a mask row of the memory array. A digit in the mask row corresponding to a respective column can be set if and only if at least one data value from the vector in a respective column matches the data value Z. Alternatively, a mask can indicate that a particular vector (e.g., arrangement of multiple digits) is stored vertically in a particular column, among other characteristics of a column. Thereafter, the digits in the mask row can be converted to a series of indices, which correspond to columns of the memory array, as described further below.

The mask row of memory cells in a memory array that is used to indicate status of other memory cells in a corresponding column of the memory array can be referred to as a mask (e.g., bitmask, digitmask). When the memory cells storing the mask are configured to store one of two data values (e.g., a binary scheme), the mask can be referred to as a bitmask.

According to various embodiments of the present invention an apparatus having PIM capabilities can be used to encode a digit position in the mask of each digit set to a particular data value. Apparatus having PIM capabilities can include memory devices that have logic configured to perform various logical operations without transferring data out of the memory array and sensing circuitry via a bus (e.g., data bus, address bus, control bus), for instance. Data is not transferred from the memory array and sensing circuitry to a processing resource off the memory device such as a processor, microprocessor, and/or compute engine, which may comprise ALU circuitry and/or other functional unit circuitry configured to perform the appropriate logical operations.

According to various embodiments, encoding the digit position of a set digit in the mask can be accomplished without iterating through the mask once for each and every digit of the mask, and can be accomplished by iterating through the mask only for each digit of the mask that is set to a particular data value (plus one). According to some embodiments, a mask can be saved and a copy of the mask can be saved. All digits of the mask that are set to a particular data value can be reset to other than the particular data value (e.g., cleared) except one. The one digit that remains set to the particular data value in the copy of the mask can be a most significant digit of the copy of the mask, for example, or a least significant digit of the copy of the mask, or some other digit of the mask set to the particular data value in the copy of the mask. For illustration, a method progressing from a most significant digit to a least significant is described herein; however, the method can be altered to progress from a least significant digit to a most significant digit, or to process digits in a different order. The copy of the mask can then be encoded to encode a digit position of the one digit that remains set to the particular data value in the copy of the mask.

The description provided herein will illustrate the apparatuses and methods based on a binary scheme using a bitmask. However, the apparatuses and methods of the present disclosure can be adapted to schemes other than binary. Although the apparatus and methods of the present disclosure are described with respect to a bitmask, the methods can be applied to any row of data stored in the memory array that is of interest.

Particular digits of a bitmask can indicate some attribute corresponding to a column of memory cells, or other information. It can be of interest to identify the digits of the bitmask that are programmed to a particular data value by their digit position in the bitmask, which may correspond to a column of the memory array. For example, it can be of interest to identify the digits of the bitmask that are programmed to a particular data value by an identifier corresponding to their digit position in the bitmask, which can correspond to a location in the memory array (e.g., a column).

According to a number of embodiments of the present disclosure, periphery logic can be used to convert a column-wise bitmask stored in a row of a memory array to a listing of indices of columns corresponding to those columns in which bits are set in the bitmask. The periphery logic can include circuitry extensions to periphery sense amplifiers of a memory device. The indices of the listing can be output as binary numbers, for example. Conversion on the memory device according to various embodiments of the present disclosure can avoid the overhead processing associated with transferring the bitmask off the chip. Furthermore, conversion on the memory device according to various embodiments of the present disclosure can improve speed and reduce time for determining the indices from previous approaches by leveraging parallel processing capabilities of the memory device.

Thus, a number of embodiments of the present disclosure can provide improved parallelism and/or reduced power consumption in association with performing compute functions as compared to previous systems including current systems and systems having an external processor (e.g., a processing resource located external from a memory array, such as on a separate integrated circuit chip). For instance, a number of embodiments can convert a bitmask to column indices without transferring data out of the memory array and sensing circuitry via a bus (e.g., data bus, address bus, control bus), for instance.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a 4F$^2$ or 6F$^2$ cell size, where "F" is a feature size corresponding to the cells. As such, the devices (e.g., logic gates) associated with ALU circuitry of current PIM systems may not be capable of being formed on pitch with the memory cells, which can affect chip size and/or memory density, for example. A number of embodiments of the present disclosure include sensing circuitry formed on pitch with memory cells of the array and controllable to perform compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, sensing circuitry 150, and/or periphery logic 170 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over an I/O bus 156 (e.g., a data bus) through I/O circuitry 144. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller. The controller 140 can control shifting data (e.g., right or left) in an array.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the controller 140 is configured to control sensing circuitry (e.g., 150) to perform logical operations on data stored in memory (e.g., array 130) and store the result back to the memory without enabling an I/O line (e.g., a local I/O line) coupled to the sensing circuitry 150. The sensing circuitry 150 can be formed on pitch with the memory cells of the array.

As such, in a number of embodiments, circuitry external to array 130 and sensing circuitry 150 is not needed to perform compute functions as the sensing circuitry 150 can be controlled to perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

The periphery logic 170 can include circuitry for converting a bitmask to column indices. The periphery logic 170 can be coupled to the memory cell of the memory array by complementary data lines, for example. According to some embodiments, the complementary data lines can extend from the array of memory cells in one direction to the sensing circuitry 150, and extend in a different (e.g., opposite) direction to the periphery logic 170. However, embodiments of this disclosure are not limited to this particular arrangement, and other locations and connections are possible by which to implement the aspects of this disclosure. The periphery logic 170 is described further with respect to FIGS. 2-4.

Figure 2:
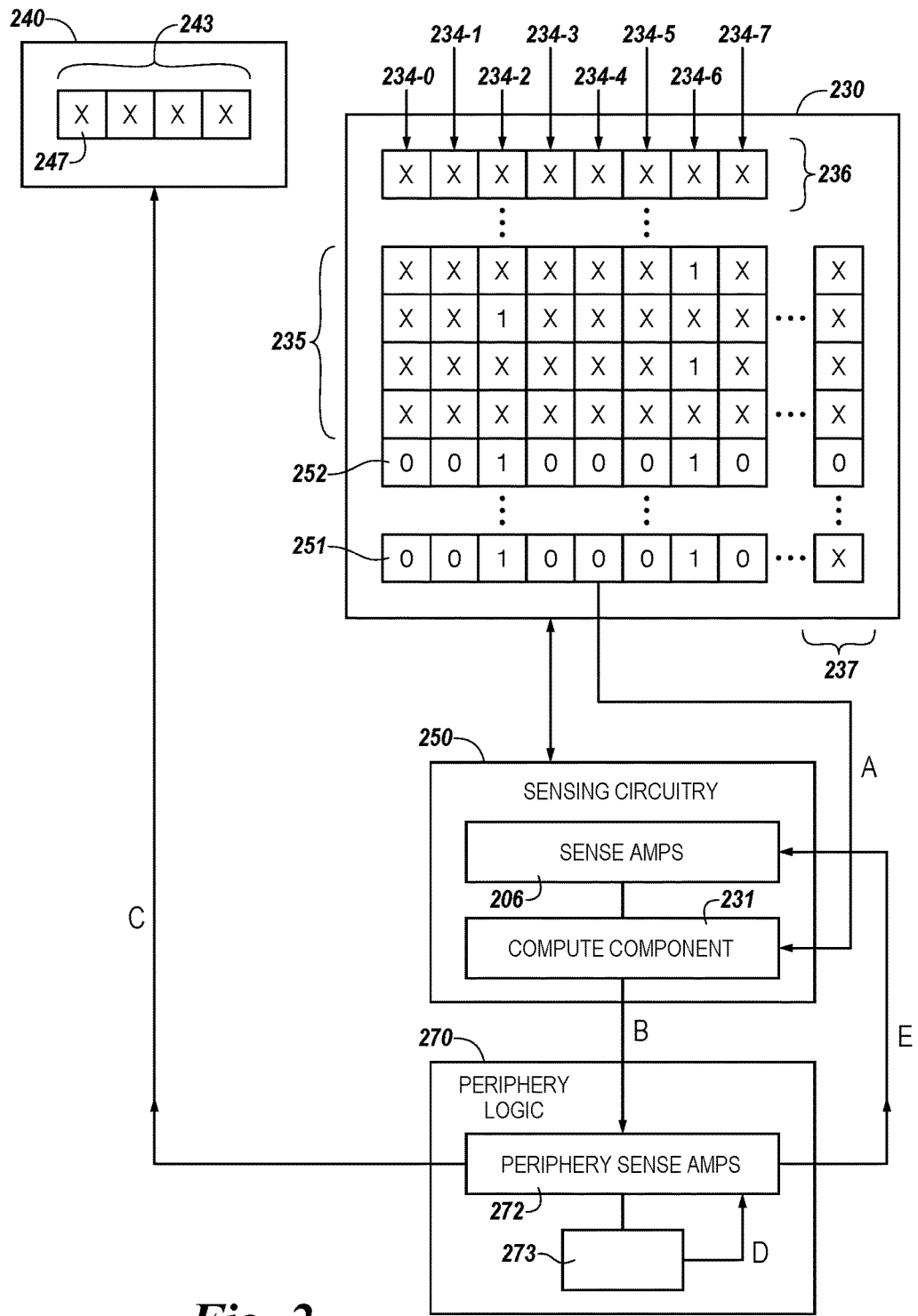
FIG. 2 illustrates a block diagram of an apparatus for converting a mask in a memory array in accordance with a number of embodiments of the present disclosure.

FIG. 2 illustrates a block diagram of an apparatus for converting a mask in a memory array in accordance with a number of embodiments of the present disclosure. FIG. 2 shows an array of memory cells 230. The memory cells can be arranged in the array 230 in rows (e.g., represented in a two-dimensional depiction as having a horizontal orientation) and columns (e.g., represented in a two-dimensional depiction as having a vertical orientation). The array 230 can include a mask row 252 of memory cells used to store a mask in the memory array. The mask row 252 can have a memory cell corresponding to each respective column of the memory array. The mask row 252 can be an intermediate row in the array 230. For example, the last row 251 of the array 230 can be used as a mask row. Data values can be loaded to the mask row 252. The mask row 252 can be used to track various aspects of respective columns.

A memory cell of the mask row 252 can correspond to a particular column of the array 230. However, embodiments of the present disclosure are not so limited and correspondence between memory cells of the mask row 252 and columns of the array 230 can be established dynamically. The mask row 252 can be used to indicate (e.g., track) particular characteristics of memory cells located in a particular column, such as whether any of the memory cells store a particular data value (e.g., columns having at least one memory cell set to a logic "1"). The memory cell in the mask row 252 can have a data value corresponding to a logic "0" in those columns that do not have any memory cells set to the particular data value, and a memory cell in the mask row 252 can have a data value corresponding to a logic "1" in those columns that do have at least one memory cell set to the particular data value. The mask row 252 shown in FIG. 2 shows an example bitmask of 00100010.

According to some embodiments of the present disclosure, data can be stored in columns of the array 230, or portion thereof (e.g., subarray). The array 230 can include the subarray 235 and additional rows 236 and columns 237 not included in the subarray 235. For example, the subarray 235 can include fewer than all of the memory cells of the array 230. Although only one subarray 235 is shown in FIG. 2 for simplicity in illustrating the present disclosure, embodiments are not so limited, and the array 230 can include a plurality of different subarrays 235, as well as additional memory cells.

FIG. 2 shows the array 230 including a mask row 252 of memory cells storing data values indicative of those columns having a particular characteristic such as columns in which at least one memory cell is storing a particular data value, or columns in which a particular vector is stored, etc.

FIG. 2 shows sensing circuitry 250 and periphery logic 270 coupled to the array 230. The sensing circuitry 250 can include a number of sense amplifiers 206 and compute components 231. The periphery logic can include a number of periphery sense amplifiers 272 and additional circuitry 273 such as circuits comprising logic gates, transistors, and an encoder. The sensing circuitry 250 and periphery logic 270 will be described in further detail with respect to other figures.

FIG. 2 also shows a controller 240 (e.g., sequencer) that is discrete from the array 230. The sequencer 240 can be, for example, a sequencer. The sequencer 240 can include a register 243 comprising a number of storage nodes (e.g., memory cells, latches, etc.) in which data values can be stored. As such, the data values in the register 243 can represent a number (e.g., a binary number). The sequencer 240 can be utilized, for example, to implement counting operation and/or a result of mathematical or other operation(s). The register 243 can be used to store a value used in or resulting from such operations. Transistors implementing the sequencer 240 can be on pitch, or not on pitch, with transistors implementing the memory cells of the memory array 230. Embodiments are not limited to a particular number of rows and/or columns in the array 230 and/or subarray 235.

As shown in FIG. 2, columns 234-2 and 234-6 store at least one data value of logic "1" in memory cells, which can be indicated by a memory cell corresponding to the respective column in mask row 252 corresponding to those columns storing a data value corresponding to a logic "1." A memory cell storing a data value corresponding to a logic "1" in a binary scheme can be referred to herein as being "set," and a memory cell storing a data value corresponding to a logic "0" in a binary scheme can be referred to herein as being "reset" or cleared. In alternate conventions, a memory cell storing a particular data value can be referred to as being set and the memory cell storing a data value other than the particular data value can be referred to as being reset or cleared. The data flow arrows A-E shown on FIG. 2 between various apparatuses are discussed in conjunction with the example method illustrated in FIG. 3.

Figure 3:
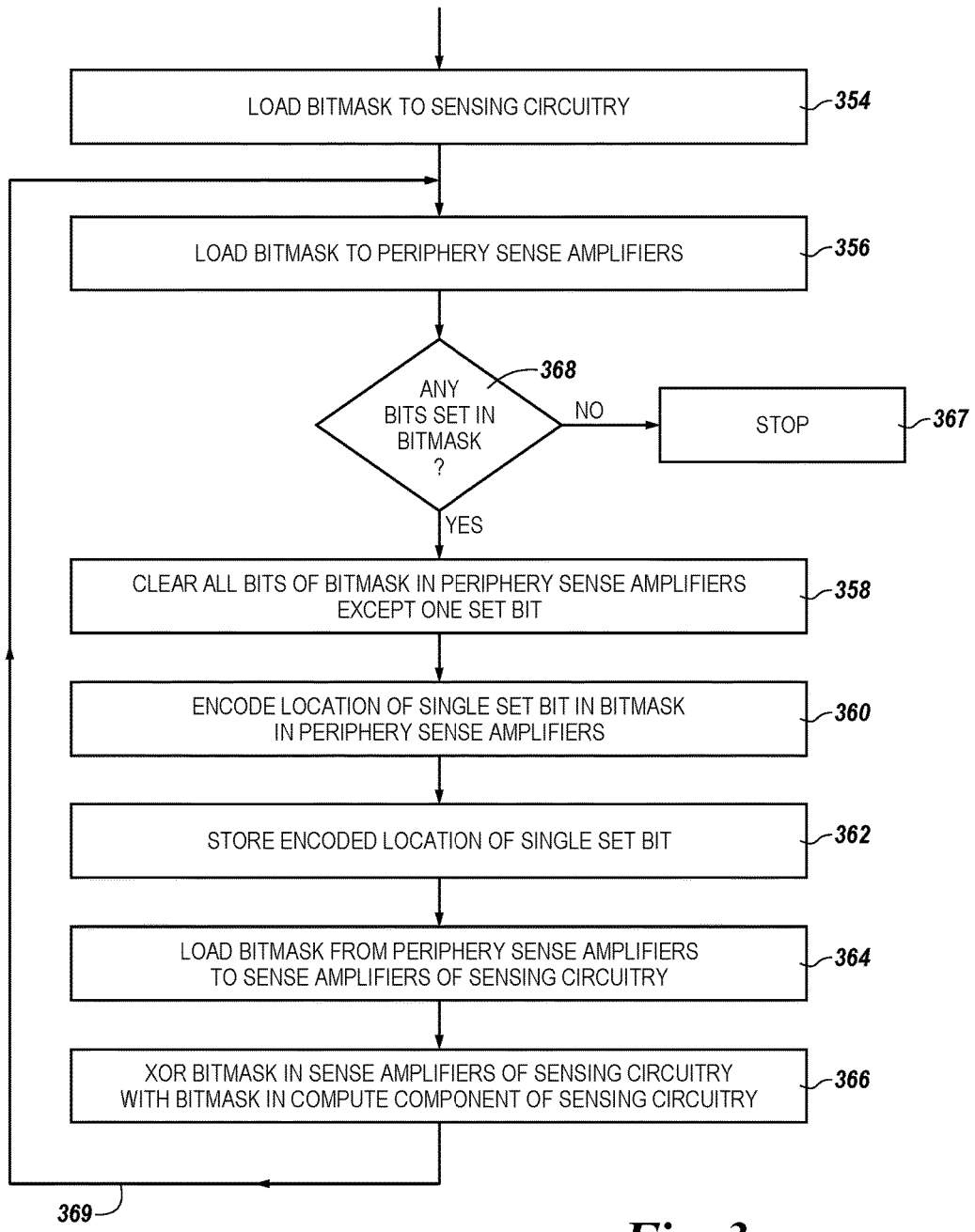
FIG. 3 illustrates a flow chart for converting a mask in a memory array in accordance with a number of embodiments of the present disclosure.

FIG. 3 illustrates a flow chart for converting a mask in a memory array in accordance with a number of embodiments of the present disclosure. A binary scheme is assumed in the following discussion; however, embodiments of the present disclosure are not so limited and the following discussion of bitmasks can be applied to masks having digits based on other than two data values. The mask row 252 shown in FIG. 2 shows an example bitmask of 00100010, which has digits set in digit positions 2 and 6 of the bitmask (as referenced from the left of the bitmask). According to various embodiments, the bitmask can be converted to a series of indices of the digit positions in the bitmask having set digits (e.g., digit positions 2 and 6 of the bitmask) for storage in registers in the sequencer 240, for example.

According to various embodiments, the memory array 230 and periphery logic 270 coupled thereto can be configured such that any row or portion thereof in (e.g., row from a subarray) can be loaded into the periphery sense amplifiers 272, either directly or indirectly (e.g., via sensing circuitry). The data values loaded into the periphery sense amplifiers 272 can be a bitmask, for example.

As previously discussed, the mask can be used as part of a search operation for some particular data value, or vector, is stored in the array. A location of the particular data (e.g., data value, vector, etc.) may be identified in whole or in part by an index of the position (e.g., column) in the array where the data is located. A vector may be stored vertically, for example, in a single column. The comparisons used for a search operation of the array can be efficiently performed on the memory device having parallel computing and logical operation capability by storing the data value being searched for in each column being searched. Thereafter, a comparison between the stored data value and a data value stored in another memory cell in the column can be performed. The comparison can be performed in parallel in multiple columns in the memory device of the present disclosure. The results of the comparison can be indicated in a row constituting a bitmask with a digit set if and only if the data value in a memory cell of the column matched the data value being searched for.

After the bitmask is generated and stored in the array, the bitmask can be converted to indices (e.g., corresponding to the columns in which the data value was found as indicated by a digit corresponding to the column being set in the bitmask) according to the method illustrated in the flow chart shown in FIG. 3. As shown at 354 in FIG. 3, the bitmask can be loaded from the array to the sensing circuitry. Loading the bitmask to the sensing circuitry stores the bitmask outside the array. According to various embodiments, the bitmask can be loaded to sense amplifiers and/or a compute component of the sensing circuitry. For example, the bitmask can be loaded from the array to a compute component of the sensing circuitry, then moved to the sense amplifiers of the sensing circuitry, and subsequently moved from the sense amplifiers of the sensing circuitry before being loaded to the periphery sense amplifiers.

The bitmask can be subsequently loaded to periphery sense amplifiers (e.g., 272 shown in FIG. 2), as shown at 356 in the flow chart of FIG. 3, from the compute component (e.g., 231 shown in FIG. 2) of the sensing circuitry (e.g., 250 shown in FIG. 2), for example. The periphery sense amplifiers (e.g., 272 shown in FIG. 2) are distinct from the sense amplifier (e.g., 206 shown in FIG. 2) portion of sensing circuitry (e.g., 250 shown in FIG. 2). According to some embodiments, the bitmask is not stored in the sensing circuitry (e.g., 250 shown in FIG. 2), and is loaded to the periphery sense amplifiers (e.g., 272 shown in FIG. 2) directly from the array (e.g., from the mask row 252 or from memory cells in the subarray 235).

According to various embodiments, the quantity of periphery sense amplifiers (e.g., 272 shown in FIG. 2) can be equal to the quantity of compute components (e.g., 231 shown in FIG. 2) in the sensing circuitry (and thus also equal to the quantity of columns in the array), and the entire bitmask can be loaded at once to the periphery sense amplifiers (e.g., 272 shown in FIG. 2). According to other embodiments, the quantity of periphery sense amplifiers (e.g., 272 shown in FIG. 2) can be different (e.g., less than) the quantity of compute components (e.g., 231 shown in FIG. 2) in the sensing circuitry, which reduces the area used by the quantity of periphery sense amplifiers (e.g., 272 shown in FIG. 2), such that only a portion of the bitmask can be loaded into the periphery sense amplifiers (e.g., 272 shown in FIG. 2) at one time. Where only a portion of the bitmask is loaded into the periphery sense amplifiers (e.g., 272 shown in FIG. 2) at a time, an offset can be used in computing indices to account for the location of the portion of the bitmask within the entire bitmask. The example bitmask (B) shown in FIG. 2 loaded into the periphery sense amplifiers (e.g., 272 shown in FIG. 2) is B=00100010, for example.

After loading into the periphery sense amplifiers, the bitmask can be evaluated for having any digits (e.g., bits) set. There may be no digits set after the XOR process of a previous iteration (XOR operation described below). If no digits are set in the bitmask, then the iterative process can stop, as indicated at 367 in FIG. 3. If at least one digit is set in the bitmask, the process can continue with the present iteration as described further below.

After determining whether any digits are set in the bitmask, all bits of the bitmask can be cleared except one set bit, as indicated at 358 in FIG. 3. According to some embodiments, only the most significant set bit is retained, and all bits of lesser significance (e.g., to the right of the most significant set bit), if any, are cleared. For example, the lesser significant set bits can be reset (e.g., from a logic "1") to a logic "0"). The result of the bitmask after clearing lesser significant set bits in the periphery sense amplifiers is B'=00100000 for the example bitmask B shown in FIG. 2. If there are no bits set in the bitmask to be cleared (e.g., from an XOR operation of a previous iteration), then there is no set bit to be retained. An output bit can be set, for example, to indicate that no bits of the bitmask are set.

With just one bit set in the bitmask B' in the periphery sense amplifiers, the digit position of the single set bit in the bitmask in the periphery sense amplifiers can be encoded, as shown at 360 in FIG. 3. For example, the bitmask B' can be encoded to an index corresponding to 6, which is the position of the only set bit in the bitmask B' (00100000). For example, the B' bitmask of 00100000 can be encoded to an index of 2 (e.g., while the $3^{rd}$ digit from the left is the only digit set, since the columns are numbered from the left with the first column being referred-to as column 0 by convention, an index of 2 can indicate that column 2 has a particular attribute). The index number can be encoded in the form of a binary number (e.g., 0010), which can represent the base 10 number 2.

The encoded digit position of the single set bit can be stored, as indicated at 362 shown in FIG. 3. For example, the binary number 0010 index of a column having a digit set in the bitmask can be provided to and stored in a register of the sequencer (e.g., 240 shown in FIG. 2) for subsequent use. Once an index is encoded from the bitmask B' in the periphery sense amplifiers (e.g., 272 shown in FIG. 2), producing indices corresponding to other digits set in bitmask B can be achieved iteratively using a similar process as described above starting with the previous bitmask, B.

According to various embodiments, the set digit(s) previously encoded can be cleared before another position of a set digit is encoded. According to one example method, the bitmask B' (00100000) can be loaded from the periphery sense amplifiers (e.g., 272 shown in FIG. 2) to sense amplifiers (e.g., 206 shown in FIG. 2) of the sensing circuitry (e.g., 250 shown in FIG. 2), as shown in the flowchart of FIG. 3 at 364. Subsequently, an XOR logical operation involving the example bitmask B' (00100000) now in the sense amplifiers (e.g., 206 shown in FIG. 2) of the sensing circuitry and the example bitmask B (00100010) previously stored in the compute component (e.g., 231 shown in FIG. 2) of the sensing circuitry, as shown at 366 of FIG. 3. The result of the XOR logical operation is 00000010 for the example being described here. The bitmask resulting from the XOR logical operation reflects the previous bitmask before lesser significant digits were cleared but with the most significant set digit also cleared (the digit position of the most significant set digit was previously encoded).

The bitmask resulting from the XOR logical operation can have one or more digits set. Another iteration of the process can begin with the bitmask resulting from the XOR operation, as indicated by the reiteration path shown at 369 in FIG. 3. For iterations after the initial iteration, for example, the bitmask resulting from the XOR logical operation can be loaded back into the periphery sense amplifiers (e.g., 272 shown in FIG. 2) as the starting bitmask of another iteration. According to some embodiments, the XOR logical operation can be implemented by the sensing circuitry (e.g., 250 shown in FIG. 2) in such a manner that the resulting value occurs, or is initially stored, in the compute component (e.g., 231 shown in FIG. 2) of the sensing circuitry (e.g., replacing the previous bitmask stored in the compute component loaded therein).

As a further illustration of the method of the present disclosure, for a second iteration, the bitmask, B, loaded into the compute component (e.g., 231 shown in FIG. 2) of the sensing circuitry is the result of the previous XOR logical operation 00000010. Thereafter, bitmask B, 00000010, is loaded to the periphery sense amplifiers (e.g., 272 shown in FIG. 2) and all digits except one (e.g., the most significant set digit) are cleared. In this example, since only one digit is set, no digits are cleared and B' is the same as B. The digit position of the single set digit (e.g., 6) is encoded and stored. The bitmask B' (00000010) is loaded from the periphery sense amplifiers (e.g., 272 shown in FIG. 2) into the sense amplifiers (e.g., 206 shown in FIG. 2) of the sensing circuitry and an XOR logical operation is implemented with the bitmask B (00000010) stored in the compute component (e.g., 231 shown in FIG. 2) of the sensing circuitry. The result of this second XOR logical operation is a null bitmask (00000000), which has no digits set.

Therefore, the iterative process of encoding digit positions of set digits can stop after 2 iterations for the example bitmask shown in FIG. 2 having 2 digits set. For example, the quantity of iterations to convert a mask to a series of indices corresponding to the digit positions of the set digits can be equal to the quantity of set digits in the mask. The example bitmask shown in FIG. 2 has 8 digits, of which 2 are set. The process described above does not have to iterate through each of all digits of the bitmask. Rather, converting the bitmask to a series of indices can be accomplished with one iteration for each set digit in the bitmask (plus one iteration to determine that no further digits are set). In most instances, the reduced number of iterations over a previous approach that checks each and every digit of a bitmask for being set or not can save processing time and energy consumed.

While the process described above included loading the bitmask B into the compute component (e.g., 231 shown in FIG. 2) of the sensing circuitry, and subsequently loading the bitmask B' into the sensing amplifier (e.g., 206 shown in FIG. 2) of the sensing circuitry, embodiments of the present disclosure are not so limited. For example, the bitmask B can be loaded into the sense amplifier (e.g., 206 shown in FIG. 2) of the sensing circuitry, and the bitmask B' can be subsequently loaded into the compute component (e.g., 231 shown in FIG. 2) of the sensing circuitry, and the XOR logical operation implemented thereafter involving the bitmasks in the sensing circuitry (e.g., 250 shown in FIG. 2) to yield a same result.

One consideration for efficiency may be the location where the result of the XOR logical operation occurs (or is initially stored). It can be beneficial to load the bitmask B into the portion of the sensing circuitry (e.g., compute component or sense amplifier) in which the result of the XOR logical operation occurs (or is initially stored) such that the previous bitmask B is replaced by the result of the XOR logical operation as a new bitmask B. According to some embodiments, the bitmask B can be loaded to/from memory cells in the array directly (e.g., not stored in the compute component before loading into the periphery sense amplifiers).

The above-described method of the present disclosure allows the conversion of a mask to indices (e.g., column indices corresponding to column locations in which memory cells associated with particular columns stored a particular data value) in a duration of time that is proportional to the number of digits set in the mask. The indices can be determined using operations (e.g., logical operations) that are local to the memory device (e.g., without communication to an off-chip processor to perform the conversion), thereby avoiding the off-chip communication and overhead incurred in the transfer of the mask.

Figure 4:
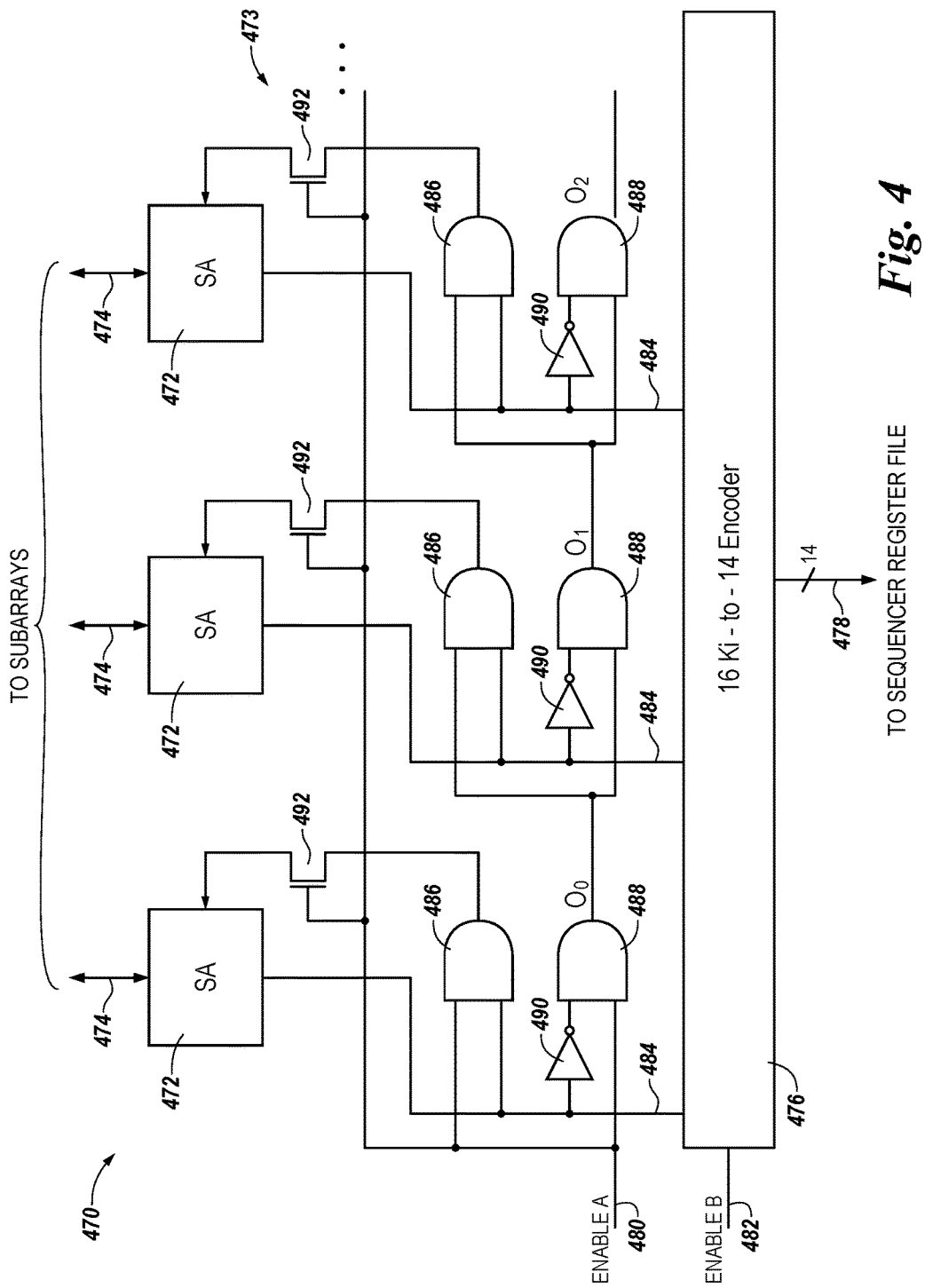
FIG. 4 illustrates a circuit for converting a mask in a memory array in accordance with a number of embodiments of the present disclosure.

FIG. 4 illustrates a circuit for converting a mask in a memory array in accordance with a number of embodiments of the present disclosure. FIG. 4 shows periphery logic 470 coupled to an array 230 (e.g., array 230 shown in FIG. 2), which can correspond to periphery logic 270 shown in FIG. 2. The periphery logic 470 can be discrete from the sensing circuitry (e.g., 250 shown in FIG. 2). Sensing circuitry can include a sense amplifier and/or a compute component coupled to the array, and a particular sensing circuitry can correspond to each respective pair of complementary sense lines.

Figure 5:
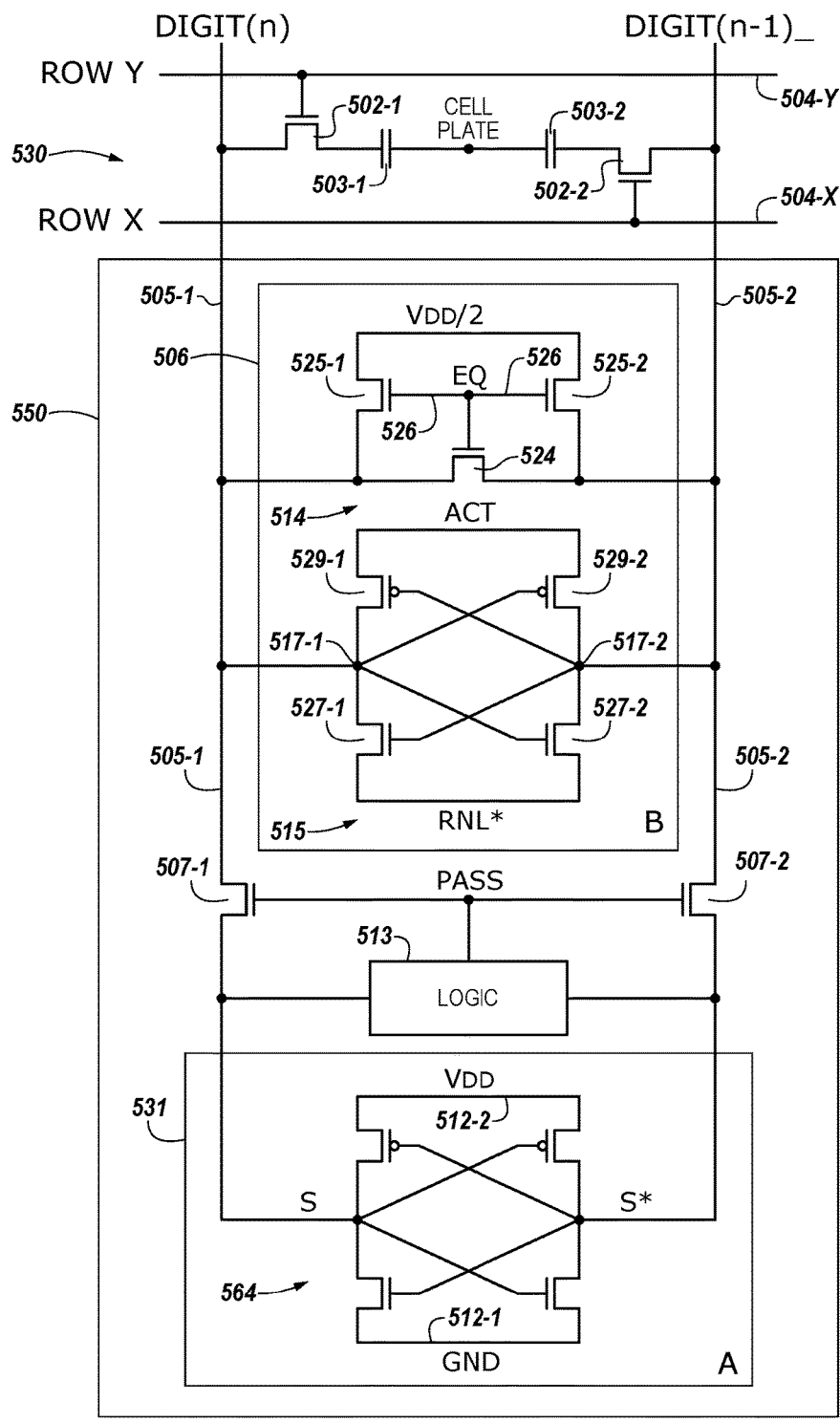
FIG. 5 is a schematic diagram illustrating sensing circuitry in accordance with a number of embodiments of the present disclosure.

The periphery logic 470 can be coupled to the array, and include a quantity of periphery sense amplifiers 472 and other circuitry 473 coupled to the array by data lines 474 (e.g., complementary data lines such as 505-1 and 505-2 shown in FIG. 5. There may be, but need not be, a 1:1 correspondence between sensing circuitry associated with a particular pair of complementary sense lines and a sense amplifier 472.

According to some embodiments of the present disclosure, the number of periphery sense amplifiers 472 is the same as the number of sense amplifiers (e.g., 506 shown in FIG. 5). Such a configuration can be used to convert column indices for an entire array or subarray all at one time, as described above. According to other embodiments of the present disclosure, the number of periphery sense amplifiers 472 is less than the number of sense amplifiers. Such a configuration can be used to convert column indices for a portion of an array or subarray, in a "batch" approach, using an offset to correlate the indices of one "batch" back to the array. A configuration in which the number of periphery sense amplifiers 472 is less than the number of sense amplifiers can be used as a footprint-saving technique, for example.

The configuration of the circuitry 473 coupled to the periphery sense amplifier located in a most significant digit position can be different than the configuration of the circuitry coupled to the periphery sense amplifier 472 located in other than the most significant digit position. According to various embodiments, and as shown in FIG. 4, configuration of the circuitry 473 coupled to the periphery sense amplifier 472 located in a most significant digit position can include a first AND gate 486 having a first input coupled to a first logic signal line 480 (e.g., communicating enable signal A), and a second input coupled to the output of the periphery sense amplifier 472 located in a most significant digit position. An inverter 490 can have an input coupled to the output of the periphery sense amplifier 472 located in a most significant digit position and an output coupled to a second AND gate 488. A second input of the second AND gate 488 can also be coupled to the first logic signal line 480. A first transistor 492 can be coupled between an output of the first AND gate 486 and an input of the periphery sense amplifier 472 located in a most significant digit position. A gate of transistor 492 can be coupled to the first logic signal line 480.

The configuration of the circuitry 473 coupled to periphery sense amplifiers 472 located in other than the most significant digit position can include a first AND gate 486 having a first input coupled to an output of the second AND gate 488 associated with the periphery amplifier 472 in the immediately more significant digit position (e.g., the second AND gate 488 associated with the periphery sense amplifier 472 located in a most significant digit position). A second input of the first AND gate 486 can be coupled to the output of the respective periphery sense amplifier 472. An inverter 490 can have an input coupled to the output of the respective periphery sense amplifier 472. A second AND gate 488 associated with the respective periphery sense amplifier 472 can have a first input coupled to the output of the inverter 490, and a second input coupled to the output of the second AND gate 488 associated with the periphery amplifier 472 in the immediately more significant digit position. Circuitry associated with additional periphery sense amplifiers 472 can be arranged similarly, and coupled to the previous and next stages as described above and shown in FIG. 4.

When the Enable A signal is activated (e.g., to a logic "1"), the AND gates associated with the periphery sense amplifier 472 located in the most significant digit position are enabled. If the data value stored in the periphery sense amplifier 472 located in the most significant digit position corresponds to a logic "1," the output of AND gate 486 associated with the periphery sense amplifier 472 located in the most significant digit position corresponds to a logic "1," which is loaded back into the periphery sense amplifier 472 located in the most significant digit position through transistor 492 (caused to conduct) via activation of the Enable A signal).

However, if the data value stored in the periphery sense amplifier 472 located in the most significant digit position corresponds to a logic "1," the output of AND gate 488 associated with the periphery sense amplifier 472 located in the most significant digit position corresponds to a logic "0," which is communicated in succession to all AND gates associated with periphery sense amplifiers 472 located in digit positions of lesser significance, which causes the outputs of all AND gates (e.g., 486 and 488) associated with periphery sense amplifiers 472 located in digit positions of lesser significance to be logic "0." These logic "0" outputs are stored back into the periphery sense amplifiers 472 located in digit positions of lesser significance since activation of the Enable A signal causes transistor 492 of each stage to have continuity. This cascading communication clears the data values stored in the periphery sense amplifiers 472 located in digit positions of lesser significance (e.g., resets the data values to a logic "0").

If the data value stored in the periphery sense amplifier 472 located in the most significant digit position corresponds to a logic "0" rather than a logic "1," the output of AND gate 486 associated with the periphery sense amplifier 472 located in the most significant digit position also corresponds to a logic "0" since one input to AND gate 486 is a logic "0," which is loaded back into the periphery sense amplifier 472 located in the most significant digit position through transistor 492. However, at the same time the output of AND gate 488 associated with the periphery sense amplifier 472 located in the most significant digit position receives the initial value from the periphery sense amplifier 472 inverted, and so has an output that corresponds to a logic "1."

The logic "1" passed to the circuitry associated with the periphery sense amplifier 472 located in the next significant digit position enables the AND gates 486 and 488. As described above with respect to the circuitry associated with the periphery sense amplifier 472 located in the most significant digit position, if the data value stored in the periphery sense amplifier 472 is a logic "1," the logic "1" is re-loaded back into the periphery sense amplifier 472 and the circuitry downstream associated with periphery sense amplifiers in positions of lesser significance are cleared (e.g., reset to a logic "0"). If the data value stored in the periphery sense amplifier 472 is a logic "0," the process continues downstream until a digit that is set is found in the mask stored in the periphery sense amplifiers 472, which is kept and all less significant digits in the mask stored in the periphery sense amplifiers 472 are cleared. The result is that the mask stored into the periphery sense amplifiers 472 has only one digit set (e.g., the most significant digit that is set is kept) and all other less-significant digits are cleared.

The circuitry 473 can also include an encoder 476 having inputs coupled to the outputs of each of the periphery sense amplifiers 472. An output of the encoder 476 can be coupled to control circuitry, such as a sequencer 240 shown in FIG. 2, in such a manner that the output of the encoder 476 can be stored in a register of the sequencer, for example. The output of the encoder 476 can subsequently be output from the register of the sequencer, and utilized in association with execution of a program, for example.

A second logic signal line 482 communicating a second logic signal (e.g., Enable B) can be coupled to the encoder 476. The encoder 476 can be configured to encode digits set in the inputs received from the periphery sense amplifiers 472 upon activation of the Enable B signal. The Enable B signal can be activated after only one digit of the mask stored in the periphery sense amplifiers 472 is set so that the number output from the encoder 476 uniquely identifies a particular column of the array that is identified by a set digit in the mask.

According to some embodiments of the present disclosure, the encoder can have a same quantity of inputs as columns in the array (or subarray) (e.g., 16,384). According to other embodiments, the encoder can have fewer inputs than there are columns in the array. In instances in which the encoder 476 has fewer inputs than a quantity of columns in the array (or subarray), a mask corresponding to the entire array (or subarray) can be converted in sections and an offset can be added to the output of the encoder 476 to correspond to the section within the array (or subarray).

Using an example binary scheme, the encoder 476 can encode the digit position of the single set bit in the mask (e.g., after all but one digit is set and digits of lesser significance than the set digit are cleared) as a binary number corresponding to the position in the mask of the set digit. When a mask corresponding to the entire array (or subarray) is being converted, the output of the encoder can correspond to a column in the array having a mask digit set. Iteratively repeating the conversion process as previously described can result in a series of numbers being output from the encoder 476 that correspond to each set bit in the mask.

The method implemented by the circuit illustrated in FIG. 4 does not iterate for each digit of the mask. Rather, the method iterates only for each set digit of the mask since the cascading enablement of the AND gates proceeds until a next set digit occurs with each iteration. Thus, fewer iterations are used in which some digits of the mask are not set compared to previous approaches that evaluate one digit of a mask per iteration.

FIG. 5 is a schematic diagram illustrating sensing circuitry 550 in accordance with a number of embodiments of the present disclosure. The sensing circuitry 550 can correspond to sensing circuitry 150 shown in FIG. 1 and/or to sensing circuitry 250 shown in FIG. 2, for example. The sense amplifier 506 of sensing circuitry 550 can correspond to sense amplifiers 206 shown in FIG. 2, and the compute component 531 of sensing circuitry 550 can correspond to compute component 231 shown in FIG. 2, for example.

A memory cell comprises a storage element (e.g., capacitor) and an access device (e.g., transistor). For instance, a first memory cell comprises transistor 502-1 and capacitor 503-1, and a second memory cell comprises transistor 502-2 and capacitor 503-2, etc. In this example, the memory array 530 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 530 can be arranged in rows coupled by word lines 504-X (Row X), 504-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 505-1 (D) and 505-2 (D_) respectively. Although only one pair of complementary data lines are shown in FIG. 5, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 502-1 can be coupled to data line 505-1 (D), a second source/drain region of transistor 502-1 can be coupled to capacitor 503-1, and a gate of a transistor 502-1 can be coupled to word line 504-X. A first source/drain region of a transistor 502-2 can be coupled to data line 505-2 (D_), a second source/drain region of transistor 502-2 can be coupled to capacitor 503-2, and a gate of a transistor 502-2 can be coupled to word line 504-Y. The cell plate, as shown in FIG. 5, can be coupled to each of capacitors 503-1 and 503-2. The cell plate can be a common node to which a reference voltage (e.g., ground) can be applied in various memory array configurations.

The memory array 530 is coupled to sensing circuitry 550 in accordance with a number of embodiments of the present disclosure. In this example, the sensing circuitry 550 comprises a sense amplifier 506 and a compute component 531 corresponding to respective columns of memory cells (e.g., coupled to respective pairs of complementary data lines). The sense amplifier 506 can be coupled to the pair of complementary sense lines 505-1 and 505-2. The compute component 531 can be coupled to the sense amplifier 506 via pass gates 507-1 and 507-2. The gates of the pass gates 507-1 and 507-2 can be coupled to logical operation selection logic 513.

The logical operation selection logic 513 can be configured to include pass gate logic for controlling pass gates that couple the pair of complementary sense lines un-transposed between the sense amplifier 506 and the compute component 531 (as shown in FIG. 5) and/or swap gate logic for controlling swap gates that couple the pair of complementary sense lines transposed between the sense amplifier 506 and the compute component 531 (as is discussed later with respect to FIG. 6, for example). The logical operation selection logic 513 can also be coupled to the pair of complementary sense lines 505-1 and 505-2. The logical operation selection logic 513 can be configured to control state of pass gates 507-1 and 507-2 based on a selected logical operation, as described in detail below for various configurations of the logical operation selection logic 513.

The sense amplifier 506 can be operated to determine a data value (e.g., logic state) stored in a selected memory cell. The sense amplifier 506 can comprise a cross coupled latch, which can be referred to herein as a primary latch. In the example illustrated in FIG. 5, the circuitry corresponding to sense amplifier 506 comprises a latch 515 including four transistors coupled to a pair of complementary data lines D 505-1 and D_ 505-2. However, embodiments are not limited to this example. The latch 515 can be a cross coupled latch (e.g., gates of a pair of transistors, such as n-channel transistors (e.g., NMOS transistors) 527-1 and 527-2 are cross coupled with the gates of another pair of transistors, such as p-channel transistors (e.g., PMOS transistors) 529-1 and 529-2). The cross coupled latch 515 comprising transistors 527-1, 527-2, 529-1, and 529-2 can be referred to as a primary latch.

In operation, when a memory cell is being sensed (e.g., read), the voltage on one of the data lines 505-1 (D) or 505-2 (D_) will be slightly greater than the voltage on the other one of data lines 505-1 (D) or 505-2 (D_). An ACT signal and the RNL* signal can be driven low to enable (e.g., fire) the sense amplifier 506. The data lines 505-1 (D) or 505-2 (D_) having the lower voltage will turn on one of the PMOS transistor 529-1 or 529-2 to a greater extent than the other of PMOS transistor 529-1 or 529-2, thereby driving high the data line 505-1 (D) or 505-2 (D_) having the higher voltage to a greater extent than the other data line 505-1 (D) or 505-2 (D_) is driven high.

Similarly, the data line 505-1 (D) or 505-2 (D_) having the higher voltage will turn on one of the NMOS transistor 527-1 or 527-2 to a greater extent than the other of the NMOS transistor 527-1 or 527-2, thereby driving low the data line 505-1 (D) or 505-2 (D_) having the lower voltage to a greater extent than the other data line 505-1 (D) or 505-2 (D_) is driven low. As a result, after a short delay, the data line 505-1 (D) or 505-2 (D_) having the slightly greater voltage is driven to the voltage of the supply voltage $V_{DD}$ through source transistor 511, and the other data line 505-1 (D) or 505-2 (D_) is driven to the voltage of the reference voltage (e.g., ground) through the sink transistor 513. Therefore, the cross coupled NMOS transistors 527-1 and 527-2 and PMOS transistors 529-1 and 529-2 serve as a sense amplifier pair, which amplify the differential voltage on the data lines 505-1 (D) and 505-2 (D_) and operate to latch a data value sensed from the selected memory cell. As used herein, the cross coupled latch of sense amplifier 506 may be referred to as a primary latch 515.

Embodiments are not limited to the sense amplifier 506 configuration illustrated in FIG. 5. As an example, the sense amplifier 506 can be current-mode sense amplifier and/or single-ended sense amplifier (e.g., sense amplifier coupled to one data line). Also, embodiments of the present disclosure are not limited to a folded data line architecture such as that shown in FIG. 5.

The sense amplifier 506 can, in conjunction with the compute component 531, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 506 can further include equilibration circuitry 514, which can be configured to equilibrate the data lines 505-1 (D) and 505-2 (D_). In this example, the equilibration circuitry 514 comprises a transistor 524 coupled between data lines 505-1 (D) and 505-2 (D_). The equilibration circuitry 514 also comprises transistors 525-1 and 525-2 each having a first source/drain region coupled to an equilibration voltage (e.g., $V_{DD}/2$), where $V_{DD}$ is a supply voltage associated with the array. A second source/drain region of transistor 525-1 can be coupled data line 505-1 (D), and a second source/drain region of transistor 525-2 can be coupled data line 505-2 (D_). Gates of transistors 524, 525-1, and 525-2 can be coupled together, and to an equilibration (EQ) control signal line 526. As such, activating EQ enables the transistors 524, 525-1, and 525-2, which effectively shorts data lines 505-1 (D) and 505-2 (D_) together and to the an equilibration voltage (e.g., $V_{DD}/2$).

Although FIG. 5 shows sense amplifier 506 comprising the equilibration circuitry 514, embodiments are not so limited, and the equilibration circuitry 514 may be implemented discretely from the sense amplifier 506, implemented in a different configuration than that shown in FIG. 5, or not implemented at all.

As described further below, in a number of embodiments, the sensing circuitry (e.g., sense amplifier 506 and compute component 531) can be controlled to perform a selected logical operation and initially store the result in one of the sense amplifier 506 or the compute component 531 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 5, the compute component 531 can also comprise a latch, which can be referred to herein as a secondary latch 564. The secondary latch 564 can be configured and operated in a manner similar to that described above with respect to the primary latch 515, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 5 at 531, and various other embodiments are described further below.

Figure 6:
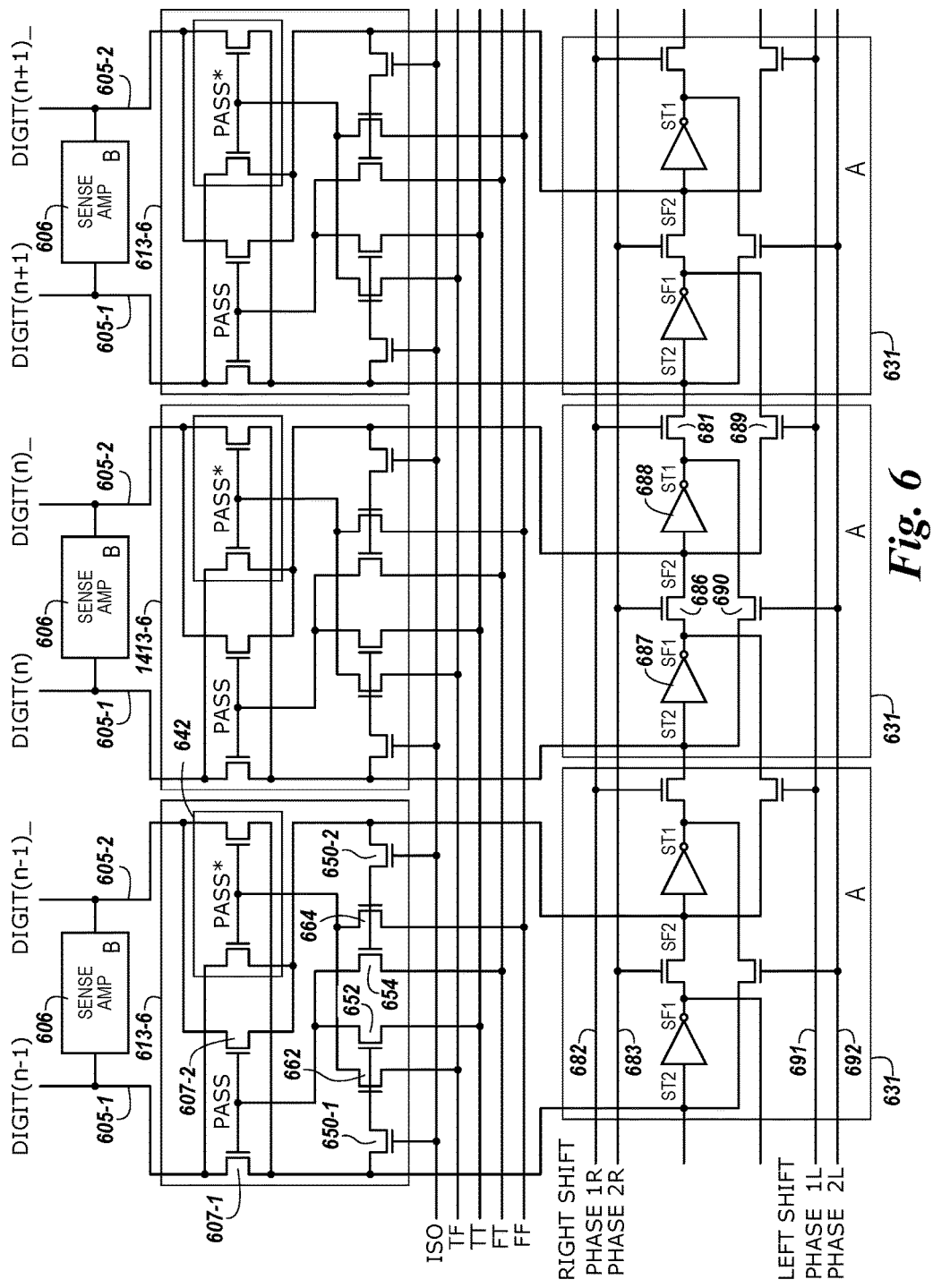
FIG. 6 is a schematic diagram illustrating sensing circuitry having selectable logical operation selection logic in accordance with a number of embodiments of the present disclosure.

FIG. 6 is a schematic diagram illustrating sensing circuitry having selectable logical operation selection logic in accordance with a number of embodiments of the present disclosure. As an example, the sensing circuitry can be controllable to perform an XOR logical operation, as described further below in association with FIG. 8. FIG. 6 shows a number of sense amplifiers 606 coupled to respective pairs of complementary sense lines 605-1 and 605-2, and a number of compute components 631 coupled to the sense amplifiers 606 via pass gates 607-1 and 607-2. The sense amplifiers 606 shown in FIG. 6 can correspond to sense amplifiers 206 shown in FIG. 2 and/or sense amplifier 506 shown in FIG. 5, for example. The compute component 631 shown in FIG. 6 can correspond to compute component 231 shown in FIG. 2, for example. The logical operation selection logic 613 shown in FIG. 6 can correspond to logical operation selection logic 513 shown in FIG. 5, for example. The gates of the pass gates 607-1 and 607-2 can be controlled by a logical operation selection logic signal, PASS. For example, an output of the logical operation selection logic can be coupled to the gates of the pass gates 607-1 and 607-2.

According to the embodiment illustrated in FIG. 6, the compute components 631 can comprise respective stages (e.g., shift cells) of a loadable shift register configured to shift data values left and right. For example, as illustrated in FIG. 6, each compute component 631 (e.g., stage) of the shift register comprises a pair of right-shift transistors 681 and 686, a pair of left-shift transistors 689 and 690, and a pair of inverters 687 and 688. The signals PHASE 1R, PHASE 2R, PHASE 1L, and PHASE 2L can be applied to respective control lines 682, 683, 691 and 692 to enable/disable feedback on the latches of the corresponding compute components 631 in association with performing logical operations and/or shifting data in accordance with embodiments described herein. Example of shifting data (e.g., from a particular compute component 631 to an adjacent compute component 631) is described further below with respect to FIG. 8.

The sensing circuitry shown in FIG. 6 also shows a logical operation selection logic 613 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 605-1 and 605-2 when the isolation transistors are enabled via the ISO control signal being asserted.

Figure 8:
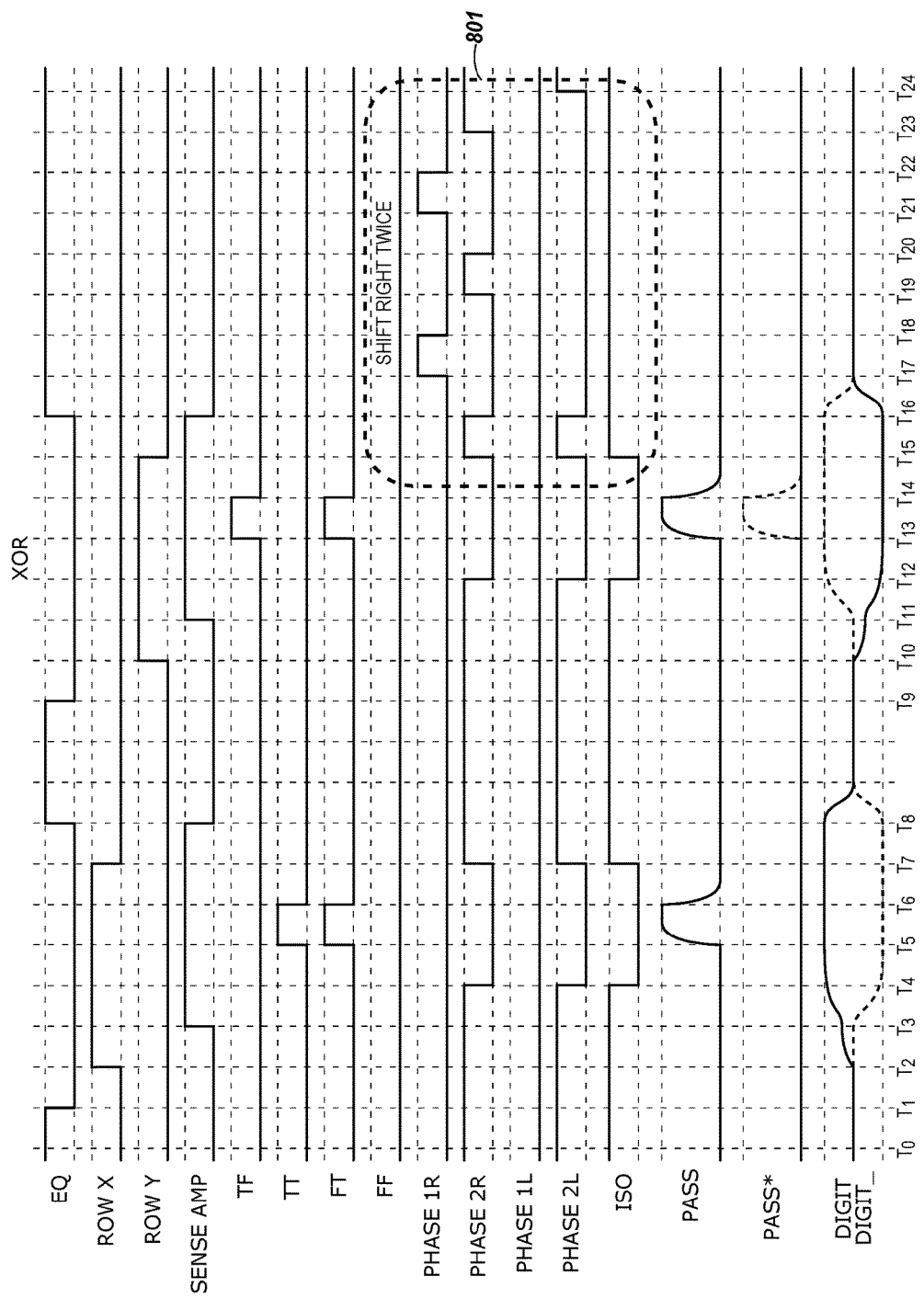
FIG. 8 illustrates a timing diagram associated with performing a logical operation and a shifting operation using the sensing circuitry in accordance with a number of embodiments of the present disclosure.

According to various embodiments, the logical operation selection logic 613 can include four logic selection transistors: logic selection transistor 662 coupled between the gates of the swap transistors 642 and a TF signal control line, logic selection transistor 652 coupled between the gates of the pass gates 607-1 and 607-2 and a TT signal control line, logic selection transistor 654 coupled between the gates of the pass gates 607-1 and 607-2 and a FT signal control line, and logic selection transistor 664 coupled between the gates of the swap transistors 642 and a FF signal control line. Gates of logic selection transistors 662 and 652 are coupled to the true sense line through isolation transistor 650-1 (having a gate coupled to an ISO signal control line). Gates of logic selection transistors 664 and 654 are coupled to the complementary sense line through isolation transistor 650-2 (also having a gate coupled to an ISO signal control line). FIG. 8 illustrates timing diagrams associated with performing logical operation and shifting operation using the sensing circuitry shown in FIG. 6.

Data values present on the pair of complementary sense lines 605-1 and 605-2 can be loaded into the compute component 631 via the pass gates 607-1 and 607-2. The compute component 631 can comprise a loadable shift register. When the pass gates 607-1 and 607-2 are OPEN, data values on the pair of complementary sense lines 605-1 and 605-2 are passed to the compute component 631 and thereby loaded into the loadable shift register. The data values on the pair of complementary sense lines 605-1 and 605-2 can be the data value stored in the sense amplifier 606 when the sense amplifier is fired. The logical operation selection logic signal, Pass, is high to OPEN the pass gates 607-1 and 607-2.

The ISO, TF, TT, FT, and FF control signals can operate to select a logical function to implement based on the data value ("B") in the sense amplifier 606 and the data value ("A") in the compute component 631. In particular, the ISO, TF, TT, FT, and FF control signals are configured to select the logical function to implement independent from the data value present on the pair of complementary sense lines 605-1 and 605-2 (although the result of the implemented logical operation can be dependent on the data value present on the pair of complementary sense lines 605-1 and 605-2). For example, the ISO, TF, TT, FT, and FF control signals select the logical operation to implement directly since the data value present on the pair of complementary sense lines 605-1 and 605-2 is not passed through logic to operate the gates of the pass gates 607-1 and 607-2.

Additionally, FIG. 6 shows swap transistors 642 configured to swap the orientation of the pair of complementary sense lines 605-1 and 605-2 between the sense amplifier 613-7 and the compute component 631. When the swap transistors 642 are OPEN, data values on the pair of complementary sense lines 605-1 and 605-2 on the sense amplifier 606 side of the swap transistors 642 are oppositely-coupled to the pair of complementary sense lines 605-1 and 605-2 on the compute component 631 side of the swap transistors 642, and thereby loaded into the loadable shift register of the compute component 631.

The logical operation selection logic signal Pass can be activated (e.g., high) to OPEN the pass gates 607-1 and 607-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 652 and 662. The data value on the complimentary sense line being a "1" OPENs logic selection transistors 654 and 664. If the ISO control signal or either the respective TT/FT control signal or the data value on the corresponding sense line (e.g., sense line to which the gate of the particular logic selection transistor is coupled) is not high, then the pass gates 607-1 and 607-2 will not be OPENed by a particular logic selection transistor.

The logical operation selection logic signal PassF can be activated (e.g., high) to OPEN the swap transistors 642 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 642 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 6 is controlled by a controller (e.g., 140 and 240) to select one of a plurality of logical operations to implement directly from the four logic selection control signals (e.g., logical operation selection is not dependent on the data value present on the pair of complementary sense lines). Some combinations of the logic selection control signals can cause both the pass gates 607-1 and 607-2 and swap transistors 642 to be OPEN at the same time, which shorts the pair of complementary sense lines 605-1 and 605-2 together. According to a number of embodiments of the present disclosure, the logical operations which can be implemented by the sensing circuitry illustrated in FIG. 6 can be the logical operations summarized in the logic tables shown in FIG. 7.

FIG. 7 is a logic table illustrating selectable logic operation results implemented by a sensing circuitry shown in FIG. 6 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1606 and compute component 631. The four control signals, in conjunction with a particular data value present on the complementary sense lines, controls the state of the pass gates 607-1 and 607-2 and swap transistors 642, which in turn affects the data value in the compute component 631 and/or sense amplifier 606 before/after firing. The capability to selectably control the swap transistors 642 facilitates implementing logical operations involving inverse data values (e.g., inverse operands and/or inverse result), among others.

Logic Table 7-1 illustrated in FIG. 7 shows the starting data value stored in the compute component 631 shown in column A at 744, and the starting data value stored in the sense amplifier 606 shown in column B at 745. The other 3 column headings in Logic Table 7-1 refer to the state of the pass gates 607-1 and 607-2, and the swap transistors 642, which can respectively be controlled to be OPEN or CLOSED depending on the state of the four logic selection control signals (e.g., TF, TT, FT, and FF), in conjunction with a particular data value present on the pair of complementary sense lines 605-1 and 605-2. The "Not Open" column (756) corresponds to the pass gates 607-1 and 607-2 and the swap transistors 642 both being in a non-conducting condition, the "Open True" (770) corresponds to the pass gates 607-1 and 607-2 being in a conducting condition, and the "Open Invert" (771) corresponds to the swap transistors 642 being in a conducting condition. The configuration corresponding to the pass gates 607-1 and 607-2 and the swap transistors 642 both being in a conducting condition is not reflected in Logic Table 7-1 since this results in the sense lines being shorted together.

Via selective control of the state of the pass gates 607-1 and 607-2 and the swap transistors 642, each of the three columns of the upper portion of Logic Table 7-1 can be combined with each of the three columns of the lower portion of Logic Table 7-1 to provide 3×3=9 different result combinations, corresponding to nine different logical operations, as indicated by the various connecting paths shown at 775. The nine different selectable logical operations that can be implemented by the sensing circuitry 650 are summarized in Logic Table 7-2 illustrated in FIG. 7, including an XOR logical operation.

The columns of Logic Table 7-2 illustrated in FIG. 7 show a heading 780 that includes the state of logic selection control signals. For example, the state of a first logic selection control signal is provided in row 776, the state of a second logic selection control signal is provided in row 777, the state of a third logic selection control signal is provided in row 778, and the state of a fourth logic selection control signal is provided in row 779. The particular logical operation corresponding to the results is summarized in row 747.

FIG. 8 illustrates a timing diagram associated with performing a logical XOR operation and a shifting operation using the sensing circuitry in accordance with a number of embodiments of the present disclosure. FIG. 8 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access lines (e.g., access lines 504-X and 504-Y shown in FIG. 5) to access a selected cell (or row of cells). The SENSE AMP signal corresponds to a signal used to enable/disable a sense amplifier (e.g., sense amplifier 606). The TF, TT, FT, and FF signals correspond to logic selection control signals such as those shown in FIG. 6 (e.g., signals coupled to logic selection transistors 662, 652, 654, and 664). The PHASE 1R, PHASE 2R, PHASE 1L, and PHASE 2L signals correspond to the control signals (e.g., clock signals) provided to respective control lines 682, 683, 691 and 692 shown in FIG. 6. The ISO signal corresponds to the signal coupled to the gates of the isolation transistors 650-1 and 650-2 shown in FIG. 6. The PASS signal corresponds to the signal coupled to the gates of pass transistors 607-1 and 607-2 shown in FIG. 6, and the PASS* signal corresponds to the signal coupled to the gates of the swap transistors 642. The DIGIT and DIGIT_ signals correspond to the signals present on the respective sense lines 605-1 (e.g., DIGIT (n)) and 605-2 (e.g., DIGIT (n)_).

The timing diagram shown in FIG. 8 is associated with performing a logical XOR operation on a ROW X data value and a ROW Y data value. In describing the logical XOR operation shown in FIG. 8, reference will be made to the sensing circuitry described in FIG. 6. For example, the logical operation described in FIG. 8 can include storing the data value of the ROW X memory cell (e.g., the "ROW X data value) in the latch of the corresponding compute component 631 (e.g., the "A" data value), which can be referred to as the accumulator 631, storing the data value of the ROW Y memory cell (e.g., the "ROW Y data value") in the latch of the corresponding sense amplifier 606 (e.g., the "B" data value), and performing a selected logical operation (e.g., a logical XOR operation in this example) on the ROW X data value and the ROW Y data value, with the result of the selected logical operation being stored in the latch of the compute component 631.

Although the examples described in FIG. 8 include the logical operation result being stored in the compute component (e.g., 631), sensing circuitry in accordance with embodiments described herein can be operated to perform logical operations with the result being initially stored in the sense amplifier. Also, embodiments are not limited to the "AND" logical operation example described in FIG. 8. For example, sensing circuitry in accordance with embodiments of the present disclosure (e.g., 650 shown in FIG. 6) can be controlled to perform various other logical operations such as those shown in Table 7-2. Also, embodiments are not limited to the right shift operation described in FIG. 8, but the compute component 631 is configured to shift bidirectionally.

As shown in FIG. 8, at time $T_1$, equilibration of the sense amplifier 606 is disabled (e.g., EQ goes low). At time $T_2$, ROW X goes high to access (e.g., select) the ROW X memory cell. At time $T_3$, the sense amplifier 606 is enabled (e.g., SENSE AMP goes high), which drives the complementary sense lines 605-1 and 605-2 to the appropriate rail voltages (e.g., $V_{DD}$ and GND) responsive to the ROW X data value (e.g., as shown by the DIGIT and DIGIT_signals), and the ROW X data value is latched in the sense amplifier 606. At time $T_4$, the PHASE 2R and PHASE 2L signals go low, which disables feedback on the latch of the compute component 631 (e.g., by turning off transistors 686 and 690, respectively) such that the value stored in the compute component may be overwritten during the logical operation. Also, at time $T_4$, ISO goes low, which disables isolation transistors 650-1 and 650-2. At time $T_5$, TT and FT are enabled (e.g., go high), which results in PASS going high (e.g., since either transistor 652 or 654 will conduct depending on which of node ST2 (corresponding to node "S" in FIG. 5) or node SF2 (corresponding to node "S*" in FIG. 5) was high when ISO was disabled at time $T_4$ (recall that when ISO is disabled, the voltages of the nodes ST2 and SF2 reside dynamically on the gates of the respective enable transistors 652 and 654). PASS going high enables the pass transistors 607-1 and 607-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 607-1 and 607-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 631 such that the ROW X data value is latched therein. Enabling ISO at time $T_7$ again couples nodes ST2 and SF2 to the gates of the enable transistors 652, 654, 662, and 664. At time $T_8$, equilibration is enabled (e.g., EQ goes high such that DIGIT and DIGIT_ are driven to an equilibrate voltage such as $V_{DD}/2$) and the sense amplifier 606 is disabled (e.g., SENSE AMP goes low).

With the ROW X data value latched in the compute component 631, equilibration is disabled (e.g., EQ goes low at time $T_5$.) with the ROW X data value being latched in the compute component 631. At time $T_{10}$, ROW Y goes high to access (e.g., select) the ROW Y memory cell. At time $T_{11}$, the sense amplifier 606 is enabled (e.g., SENSE AMP goes high), which drives the complementary sense lines 605-1 and 605-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 606. At time $T_{12}$, the PHASE 2R and PHASE 2L signals go low, which disables feedback on the latch of the compute component 631 (e.g., by turning off transistors 686 and 690, respectively) such that the value stored in the compute component 631 may be overwritten during the logical operation. Also, at time $T_{12}$, ISO goes low, which disables isolation transistors 650-1 and 650-2. Since the desired logical operation in this example is an XOR operation, at time $T_{13}$, TF and FT are enabled while TT and FF remain disabled (as shown in TABLE 7-2, FF=0, FT=1, TF=1, and TT=0 corresponds to a logical XOR (e.g., "AXB") operation). Whether enabling TF and FT results in PASS or PASS* going high depends on the value stored in the compute component 631 when ISO is disabled at time $T_{12}$. For example, enable transistor 662 will conduct if node ST2 was high when ISO is disabled, and enable transistor 662 will not conduct if node ST2 was low when ISO was disabled at time $T_{12}$. Similarly, enable transistor 654 will conduct if node SF2 was high when ISO is disabled, and enable transistor 654 will not conduct if node SF2 was low when ISO is disabled.

In this example, if PASS goes high at time $T_{13}$, the pass transistors 607-1 and 607-2 are enabled such that the DIGIT and DIGIT_signals, which correspond to the ROW Y data value, are provided to the respective compute component nodes ST2 and SF2. As such, the value stored in the compute component 631 (e.g., the ROW X data value) may be flipped, depending on the value of DIGIT and DIGIT (e.g., the ROW Y data value). In this example, if PASS stays low at time $T_{13}$, the pass transistors 607-1 and 607-2 are not enabled such that the DIGIT and DIGIT_signals, which correspond to the ROW Y data value, remain isolated from the nodes ST2 and SF2 of the compute component 631. As such, the data value in the compute component (e.g., the ROW X data value) would remain the same. In this example, if PASS* goes high at time $T_{13}$, the swap transistors 642 are enabled such that the DIGIT and DIGIT_signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 631 (e.g., the ROW X data value) may be flipped, depending on the value of DIGIT and DIGIT (e.g., the ROW Y data value). In this example, if PASS* stays low at time $T_{13}$, the swap transistors 642 are not enabled such that the DIGIT and DIGIT_signals, which correspond to the ROW Y data value, remain isolated from the nodes ST2 and SF2 of the compute component 631. As such, the data value in the compute component (e.g., the ROW X data value) would remain the same.

At time $T_{14}$, TF and FT are disabled, which results in PASS and PASS* going (or remaining) low, such that the pass transistors 607-1 and 607-2 and swap transistors 642 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 631 such that the result of the XOR operation (e.g., "A" XOR "B") is latched therein. Enabling ISO at time $T_{15}$ again couples nodes ST2 and SF2 to the gates of the enable transistors 652, 654, 662, and 664. At time $T_{16}$, equilibration is enabled (e.g., EQ goes high such that DIGIT and DIGIT_ are driven to an equilibrate voltage) and the sense amplifier 606 is disabled (e.g., SENSE AMP goes low).

The result of the XOR operation, which is initially stored in the compute component 631 in this example, can be transferred back to the memory array (e.g., to a memory cell coupled to ROW X, ROW Y, and/or a different row via the complementary sense lines) and/or to an external location (e.g., an external processing component) via I/O lines.

FIG. 8 also includes (e.g., at 801) signaling associated with shifting data (e.g., from a compute component 631 to an adjacent compute component 631). The example shown in FIG. 8 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 681 to conduct, which causes the data value at node ST1 to move right to node ST2 of a right-adjacent compute component 631. PHASE 2R is subsequently enabled at time $T_{19}$ and disabled at time $T_{20}$. Enabling PHASE 2R causes transistor 686 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a memory device comprising an array of memory cells; and
   a processing resource, external to the memory device, and configured to execute a program that uses column indices indicating those columns of the memory array having a particular attribute; and
   wherein the memory device is configured to:
      load a mask from compute components to periphery sense amplifiers; and
      convert set digits of the mask to the column indices, wherein the column indices indicate the columns of the memory array having the particular attribute by performing logical operations using the mask and the compute components and wherein the particular attribute is a data value.

2. The system of claim 1, wherein the memory device is further configured to provide the column indices from the memory device to the processing resource.

3. The system of claim 2, wherein the processing resource is further configured to request the column indices from the memory device in association with executing the program using the column indices.

4. The system of claim 3, wherein the processing resource is configured to continue execution of the program using the column indices.

5. The system of claim 3, wherein the memory device comprises a controller configured to receive the request for column indices.

6. The system of claim 5, wherein the controller is configured to decode signals provided by a control bus from the processing resource.

7. The system of claim 5, wherein the controller is a state machine.

8. The system of claim 1, wherein the system is a server.

9. The system of claim 1, wherein the processing resource is a host processor.

10. The system of claim 1, wherein the processing resource is a controller.

11. The system of claim 1, wherein the system has a Von Neumann architecture.

12. The system of claim 1, wherein the processing resource and the memory device are a same integrated circuit (IC).

13. The system of claim 1, wherein the processing resource is coupled to a mother board.

14. A method, comprising:
   providing, by a host, a first mask to a memory device to store in an array of memory cells, wherein set digits of the first mask indicate columns of the array having a particular attribute;
   providing, by a host, a request for the column indices identified by the first mask; and
   responsive to receiving the request for the column indices at the memory device, loading the first mask from the array using a first quantity of sense amplifiers and compute components into periphery logic coupled to the array and comprising a second quantity of sense amplifiers and logic configured to convert the set digits of the first mask to the column indices, wherein the column indices indicate columns of the array having the particular attribute by performing logical operations using the mask and the compute components and wherein the particular attribute is a data value.

15. The method of claim 14, wherein converting the first mask to column indices comprises:
   performing a number of iterations of operations, each iteration comprising:
      determining a second mask from the first mask, all constituent digits of the second mask being reset other than for one constituent digit of the second mask that is a set digit which corresponds to one particular set digit in the first mask;
      encoding a digit position of the set digit of the second mask as an index; and
      resetting the one particular set digit in the first mask corresponding to the one constituent digit of the second mask that is the set digit.

16. The method of claim 15, wherein resetting the one particular set digit in the first mask includes performing an XOR logical operation between the first mask and the second mask.

17. The method of claim 15, wherein determining the second mask from the first mask includes:
   making a copy of the first mask;
   resetting all digits of the copy of the first mask that are less significant than a most significant digit (MSD) that is set in the copy of the first mask; and
   storing the copy of the first mask having only the MSD set as the second mask.

18. The method of claim 15, wherein determining the second mask from the first mask includes:
   making a copy of the first mask;
   resetting all digits of the copy of the first mask that are more significant than a least significant digit (LSD) that is set in the copy of the first mask; and storing the copy of the first mask with only the LSD set as the second mask.

19. A system comprising:
a memory device comprising an array of memory cells; and
a processing resource, external to the memory device, and configured to execute a program that uses column indices indicating those columns of the memory array having a particular attribute; and
wherein the memory device is configured to:
  generate the column indices indicating those columns of the memory array having a particular attribute by converting a bit mask stored in sensing circuitry of the array to the column indices without transferring the bit mask to the processing resource and wherein the particular attribute is a data value; and
  subsequent to converting the bit mask, provide the generated column indices to the processing resource in association with execution of the program.

20. The system of claim 19, wherein the memory device comprises a controller configured to generate the column indices; and wherein the sensing circuitry comprises a plurality of sense amplifiers and corresponding compute components.

* * * * *